(12) United States Patent
Shibata

(10) Patent No.: US 11,449,742 B2
(45) Date of Patent: Sep. 20, 2022

(54) PRODUCT-SUM OPERATION DEVICE, NEUROMORPHIC DEVICE, AND METHOD FOR USING PRODUCT-SUM OPERATION DEVICE

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 372 days.

(21) Appl. No.: 16/758,883

(22) PCT Filed: Dec. 12, 2018

(86) PCT No.: PCT/JP2018/045742
§ 371 (c)(1),
(2) Date: Apr. 24, 2020

(87) PCT Pub. No.: WO2019/131147
PCT Pub. Date: Jul. 4, 2019

(65) Prior Publication Data
US 2020/0342298 A1    Oct. 29, 2020

(30) Foreign Application Priority Data
Dec. 28, 2017  (JP) .............................. JP2017-254662

(51) Int. Cl.
*G06N 3/063* (2006.01)
*G06F 9/30* (2018.01)
*G06G 7/16* (2006.01)

(52) U.S. Cl.
CPC ......... *G06N 3/0635* (2013.01); *G06F 9/3001* (2013.01); *G06F 9/30036* (2013.01); *G06G 7/16* (2013.01)

(58) Field of Classification Search
CPC . G06N 3/0635; G06F 9/3001; G06F 9/30036; G06G 7/16
(Continued)

(56) References Cited

U.S. PATENT DOCUMENTS 10,831,447 B2 * 11/2020 Morie ................. G06N 3/0481
2018/0350432 A1   12/2018 Sasaki
(Continued)

FOREIGN PATENT DOCUMENTS

| JP | 5160304 B2 | 3/2013 |
| WO | 2017/183573 A1 | 10/2017 |
| WO | 2018/034163 A1 | 2/2018 |

OTHER PUBLICATIONS

Zhe Chen et al., "Optimized Learning Scheme for Grayscale Image Recognition in a RRAM Based Analog Neuromorphic System" Institute of Microelectronics, pp. 17.7.1-17.7.4, 2015.
(Continued)

*Primary Examiner* — Hai L Nguyen
(74) *Attorney, Agent, or Firm* — Oliff PLC

(57) ABSTRACT

A product-sum operation device includes a product operator and a sum operator. The product operator includes a plurality of variable-input product operation elements and a plurality of fixed-input product operation elements. Each of the plurality of variable-input product operation elements and the plurality of fixed-input product operation elements and is a resistance change element. The product-sum operation device includes variable input units and that input a variable signal to a plurality of variable-input product operation elements and fixed input units and that input a determined signal to the plurality of fixed-input product operation elements and in synchronization with the variable signal. The sum operator includes an output detector that determines the sum of outputs from the plurality of variable-input product operation elements and outputs from the plurality of fixed-input product operation elements.

9 Claims, 9 Drawing Sheets

(58) Field of Classification Search
USPC .................................................... 708/7, 835
See application file for complete search history.

(56) References Cited

U.S. PATENT DOCUMENTS

2019/0171418 A1    6/2019   Morie et al.
2020/0327400 A1*  10/2020   Shibata ................ G06F 7/5443

OTHER PUBLICATIONS

Sebastian Raschka, Python Machine Learning, Impress, 2016, pp. 328-330.
Geoffrey W. Burr et al. "Neuromorphic computing using non-volatile memory" Advances in Physics: X, vol. 2, No. 1, pp. 89-124, 2017.
Mar. 12, 2019 International Search Report issued in International Patent Application No. PCT/JP2018/045742.

* cited by examiner

PRODUCT-SUM OPERATION DEVICE, NEUROMORPHIC DEVICE, AND METHOD FOR USING PRODUCT-SUM OPERATION DEVICE

TECHNICAL FIELD

The present invention relates to a product-sum operation device, a neuromorphic device, and a method for using the product-sum operation device. Priority is claimed on Japanese Patent Application No. 2017-254662, filed Dec. 28, 2017, the content of which is incorporated herein by reference.

BACKGROUND ART

In the related art, a learning scheme optimized for grayscale image recognition in an RRAM (registered trademark)-based analog neuromorphic system is known (see, for example, Non-Patent Document 1). This literature describes development of an analog neuromorphic system on the basis of an assembled resistance switching memory array. This literature proposes a new training scheme to optimize the performance of analog systems by utilizing segmented synaptic behaviors. This literature also applies the scheme to grayscale image recognition.

Research has also been conducted to realize a neural network imitating a nervous system by using an array of resistance change elements. A neuromorphic device (NMD) performs a product-sum operation to product weight and sum values from the previous stage to the next stage. Thus, development of various types of product-sum operation devices, each of which combines a plurality of resistance change elements whose resistances change continuously, performs product operations on input signals using their resistance values as weights, and performs sum operation to obtain the sum of currents output from the resistance change elements, and NMDs using the product-sum operation devices has been promoted.

A multilayer perceptron widely used in neural networks includes an input layer, one or more hidden layers, and an output layer, each of which is associated with an appropriate weight (coupling strength) and bias term (see, for example, Non-Patent Document 2).

CITATION LIST

Patent Literature

[Patent Document 1]
  PCT International Publication No. WO2017/183573
[Non-Patent Document]
[Non-Patent Document 1]
  Zhe Chen et al., "Optimized Learning Scheme for Grayscale Image Recognition in a RRAM Based Analog Neuromorphic System," 2015, IEEE, p. 17.7.1-p. 17.7.4
[Non-Patent Document 2]
  Sebastian Raschka, "Python Machine Learning Programming," in press, p. 328-330

SUMMARY OF INVENTION

Technical Problem

However, Non-Patent Document 1 does not discuss how to configure bias term elements. When a bias term element has malfunctioned, the performance of the neural network may be greatly degraded depending on the configuration of the bias term element. This is because the value of "weight" is generally set for each specific combination, whereas the bias term is used to bias all values of the layer.

In view of the above problems, it is an object of the present invention to provide a product-sum operation device, a neuromorphic device, and a method for using the product-sum operation device which can, when applied to a neural network, curb a reduction in the performance of the neural network when a bias term element has malfunctioned.

Solution to Problem

A product-sum operation device of an aspect of the present invention includes a product operator and a sum operator, wherein the product operator includes a plurality of variable-input product operation elements and a plurality of fixed-input product operation elements, each of the plurality of variable-input product operation elements and the plurality of fixed-input product operation elements is a resistance change element, the product-sum operation device further includes a variable input unit configured to input a variable signal to the plurality of variable-input product operation elements, and a fixed input unit configured to input a determined signal to the plurality of fixed-input product operation elements in synchronization with the variable signal, and the sum operator includes an output detector configured to detect a sum of outputs from the plurality of variable-input product operation elements and outputs from the plurality of fixed-input product operation elements.

In the product-sum operation device of an aspect of the present invention, the plurality of fixed-input product operation elements may have a function of being disconnected when an output current increase malfunction has occurred.

In the product-sum operation device of an aspect of the present invention, the resistance change element may have a write terminal, a common terminal, and a read terminal.

In the product-sum operation device of an aspect of the present invention, the resistance change element may be a magnetoresistance effect element exhibiting a magnetoresistance effect, and the magnetoresistance effect element may include a magnetization free layer having a domain wall, a magnetization fixed layer whose magnetization direction is fixed, and a nonmagnetic layer sandwiched between the magnetization free layer and the magnetization fixed layer.

In the product-sum operation device of an aspect of the present invention, the product operator may further include another variable-input product operation element and another fixed-input product operation element, each of the other variable-input product operation elements and the other fixed-input product operation elements may be the resistance change element, the variable input unit may be configured to input the variable signal to the other variable-input product operation element, the fixed input unit may be configured to input the determined signal to the other fixed-input product operation element in synchronization with the variable signal, and the sum operator may further include another output detector configured to detect a sum of an output from the other variable-input product operation element and an output from the other fixed-input product operation element.

An aspect of the present invention is a neuromorphic device including the product-sum operation device.

An aspect of the present invention is a method for using the product-sum operation device, wherein the product-sum operation device further includes a malfunction diagnosis unit, and the method includes an output detection process in which the output detector detects outputs from the plurality of fixed-input product operation elements in a state in which the variable input unit does not input the variable signal to the plurality of variable-input product operation elements and the fixed input unit inputs the determined signal to the plurality of fixed-input product operation elements, and a diagnosis process in which the malfunction diagnosis unit determines whether or not a malfunctioning product operation element is included in the plurality of fixed-input product operation elements on the basis of the outputs from the plurality of fixed-input product operation elements detected by the malfunction diagnosis unit in the output detection process.

In the method for using the product-sum operation device of an aspect of the present invention, the product-sum operation device may further include a relearning unit, and the method may further include a relearning process in which when the malfunction diagnosis unit has determined that a malfunctioning product operation element is included in the plurality of fixed-input product operation elements, the relearning unit resets a resistance value of a product operation element other than the malfunctioning product operation element among the plurality of fixed-input product operation elements.

Advantageous Effects of Invention

According to the present invention, it is possible to provide a product-sum operation device, a neuromorphic device, and a method for using the product-sum operation device which can, when applied to a neural network, curb a reduction in the performance of the neural network when a bias term element has malfunctioned.

BRIEF DESCRIPTION OF DRAWINGS

FIG. 4 is a diagram showing changes in an output current from a magnetoresistance effect element via a read terminal shown in FIG. 3 and the like.

DESCRIPTION OF EMBODIMENTS

Hereinafter, embodiments of a product-sum operation device, a neuromorphic device, and a method for using the product-sum operation device according to the present invention will be described with reference to the drawings.
<First Embodiment> (where Resistance Change Elements are Magnetoresistance Effect Elements)

Figure 1:
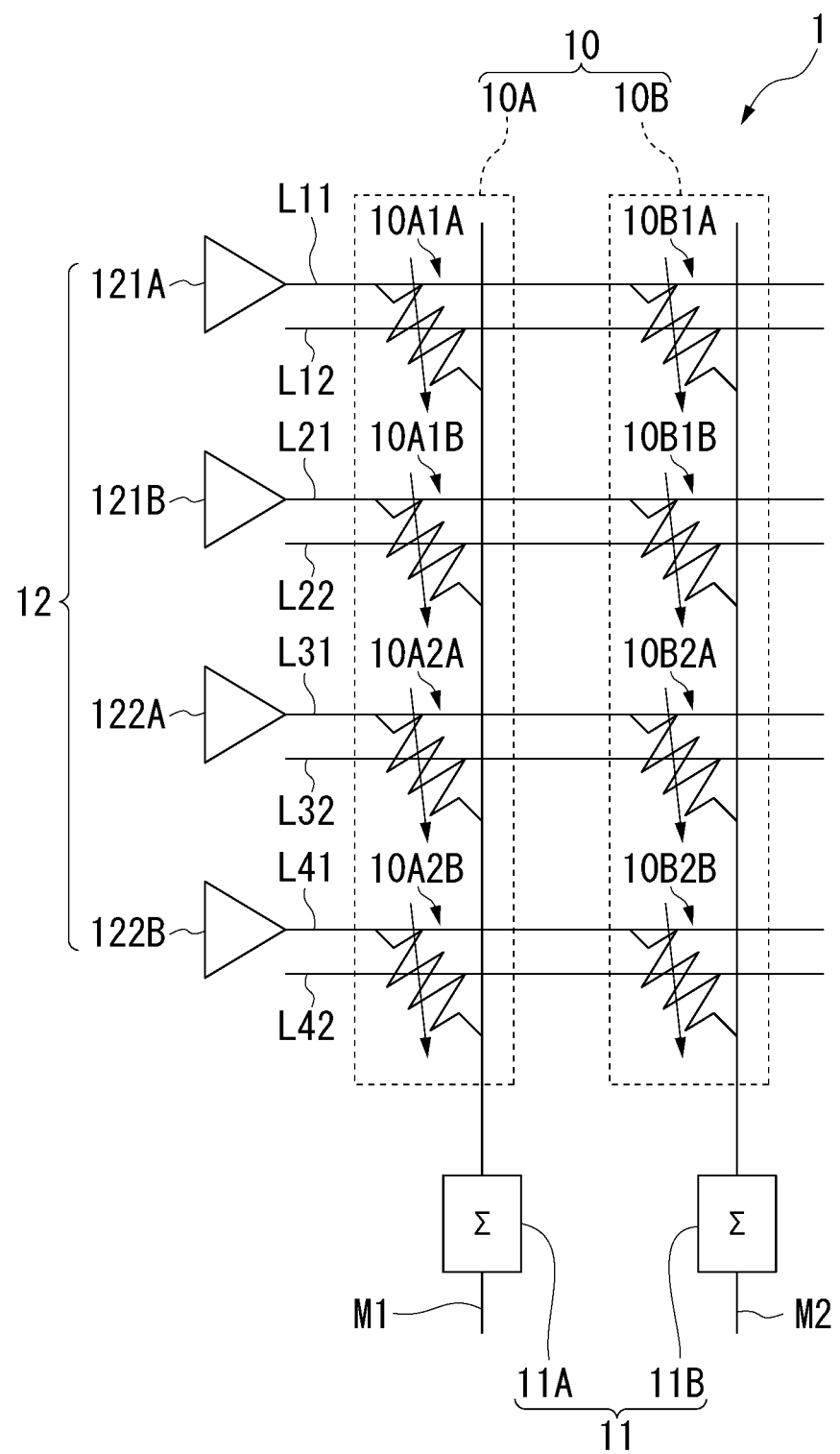
FIG. 1 is a diagram showing an example of a partial configuration of a product-sum operation device of a first embodiment.

FIG. 1 is a diagram showing an example of a partial configuration of a product-sum operation device 1 of a first embodiment.

In the example shown in FIG. 1, the product-sum operation device 1 of the first embodiment includes a product operator 10, a sum operator 11, and an input unit 12. The product operator 10 includes a column 10A and a column 10B. The input unit 12 includes variable input units 121A and 121B and fixed input units 122A and 122B.

In the example shown in FIG. 1, the product operator 10 includes two columns 10A and 10B. However, in another example, the product operator 10 may include any number, more than two, of columns 10A, 10B, . . . .

In the example shown in FIG. 1, the column 10A includes variable-input product operation elements 10A1A and 10A1B and fixed-input product operation elements 10A2A and 10A2B. The column 10B includes variable-input product operation elements 10B1A and 10B1B and fixed-input product operation elements 10B2A and 10B2B.

In the example shown in FIG. 1, the column 10A includes two variable-input product operation elements 10A1A and 10A1B and two fixed-input product operation elements 10A2A and 10A2B, and the column 10B includes two variable-input product operation elements 10B1A and 10B1B and two fixed-input product operation elements 10B2A and 10B2B. However, in another example, the column 10A may include any number (specifically, a plurality) of variable-input product operation elements other than two and any number (specifically, a plurality) of fixed-input product operation elements other than two, and the column 10B may include any number (specifically, a plurality) of variable-input product operation elements other than two and any number (specifically, a plurality) of fixed-input product operation elements other than two.

In the example shown in FIG. 1, each of the plurality of variable-input product operation elements 10A1A, 10A1B, 10B1A, and 10B1B and the plurality of fixed-input product operation elements 10A2A, 10A2B, 10B2A, and 10B2B is a resistance change element including a read terminal, a write terminal, and a common terminal.

The read terminals of the variable-input product operation elements 10A1A and 10B1A are connected to a line L11. The line L11 is connected to a variable input unit 121A that inputs a variable signal to the variable-input product operation elements 10A1A and 10B1A. The write terminals of the variable-input product operation elements 10A1A and 10B1A are connected to a line L12.

The read terminals of the variable-input product operation elements 10A1B and 10B1B are connected to a line L21. The line L21 is connected to a variable input unit 121B that inputs a variable signal to the variable-input product operation elements 10A1B and 10B1B. The write terminals of the variable-input product operation elements 10A1B and 10B1B are connected to a line L22.

The read terminals of the fixed-input product operation elements 10A2A and 10B2A are connected to a line L31. The line L31 is connected to a fixed input unit 122A that inputs a fixed signal, which is a determined signal, to the fixed-input product operation elements 10A2A and 10B2A. The write terminals of the fixed-input product operation elements 10A2A and 10B2A are connected to a line L32.

The read terminals of the fixed-input product operation elements 10A2B and 10B2B are connected to a line L41. The line L41 is connected to a fixed input unit 122B that inputs a fixed signal, which is a determined signal, to the fixed-input product operation elements 10A2B and 10B2B. The write terminals of the fixed-input product operation elements 10A2B and 10B2B are connected to a line L42.

The fixed signals input to the fixed-input product operation elements 10A2A, 10A2B, 10B2A, and 10B2B are input in synchronized with the variable signals input to the variable-input product operation elements 10A1A, 10A1B, 10B1A, and 10B1B.

The common terminals of the variable-input product operation elements 10A1A and 10A1B and the fixed-input product operation elements 10A2A and 10A2B are connected to a line M1. The common terminals of the variable-input product operation elements 10B1A and 10B1B and the fixed-input product operation elements 10B2A and 10B2B are connected to a line M2.

The sum operator 11 includes output detectors 11A and 11B. The output detector 11A detects the sum of outputs from the variable-input product operation elements 10A1A and 10A1B and outputs from the fixed-input product operation elements 10A2A and 10A2B. The output detector 11B detects the sum of outputs from the variable-input product operation elements 10B1A and 10B1B and outputs from the fixed-input product operation elements 10B2A and 10B2B. The output detector 11A is disposed on the line M1. The output detector 11B is disposed on the line M2.

In the example shown in FIG. 1, the output detector 11A detects output current values from the variable-input product operation elements 10A1A and 10A1B and the fixed-input product operation elements 10A2A and 10A2B, and the output detector 11B detects output current values from the variable-input product operation elements 10B1A and 10B1B and the fixed-input product operation elements 10B2A and 10B2B. However, in another example, the output detector 11A may detect output charges from the variable-input product operation elements 10A1A and 10A1B and the fixed-input product operation elements 10A2A and 10A2B, and the output detector 11B may detect output charges from the variable-input product operation elements 10B1A and 10B1B and the fixed-input product operation elements 10B2A and 10B2B.

Resistance change elements used as the product operation elements in the present invention are elements whose electric resistance reversibly changes in response to an external stimulus (such as a current, a voltage, or a magnetic field). Examples of the resistance change elements include a resistance change memory (RRAM) element, a phase change memory (PCRAM) element, an anisotropic magnetoresistance effect (AMR) element, a tunnel magnetoresistance effect (TMR) element, and a giant magnetoresistance effect (GMR) element.

Figure 2:
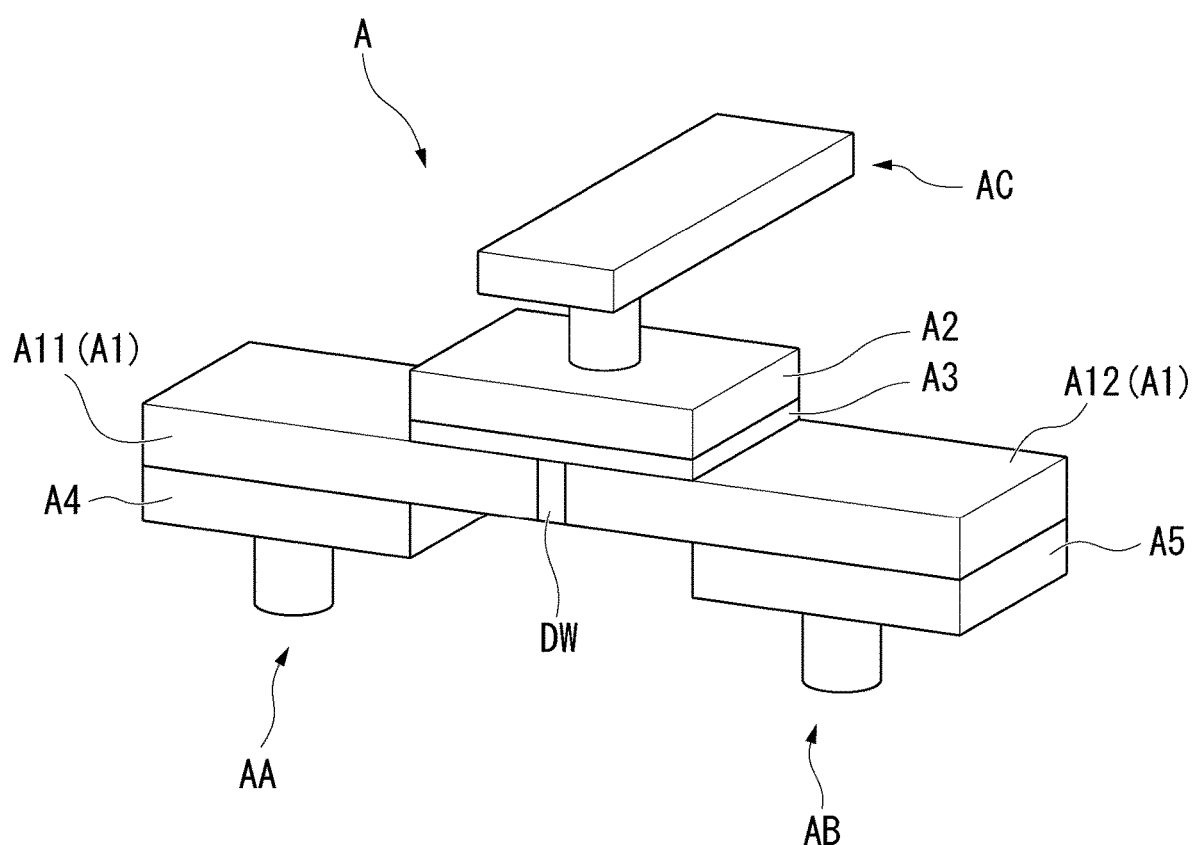
FIG. 2 is a perspective view showing an example of a resistance change element applicable as a variable-input product operation element of the product-sum operation device of the first embodiment.

FIG. 2 is a perspective view showing an example of a resistance change element applicable as each of the variable-input product operation elements 10A1A, 10A1B, 10B1A, and 10B1B of the product-sum operation device 1 of the first embodiment.

In the example shown in FIG. 2, the resistance change element is a magnetoresistance effect element A exhibiting a magnetoresistance effect.

The magnetoresistance effect element A includes a magnetization free layer A1 having a domain wall DW, a magnetization fixed layer A2 whose magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the domain wall DW and a second region A12 on the other side of the domain wall DW. The first region A11 is disposed with a write terminal AA. The second region A12 is disposed with a common terminal AB. The magnetization fixed layer A2 is disposed with a read terminal AC.

The amount of movement (movement distance) of the domain wall DW can be variably controlled by adjusting the magnitude and duration of a write current that flows between the write terminal AA and the common terminal AB. The amount of movement (movement distance) of the domain wall DW can be set with the magnitude and duration of the write current, for example, using the number of pulses or the pulse width. When the area of a portion where the magnetization directions of the magnetization fixed layer A2 and the magnetization free layer A1 are parallel (or antiparallel) continuously changes by driving (moving) the domain wall DW, the ratio between the area proportion of the portion where the magnetization directions are parallel and the area proportion of the portion where the magnetization directions are antiparallel continuously changes, thus obtaining a nearly linear resistance change in the magnetoresistance effect element.

Further, data can be read by flowing current between the read terminal AC and the common terminal AB and detecting a resistance corresponding to the ratio between the area proportion of the portion where the magnetization directions are parallel and the area proportion of the portion where the magnetization directions are antiparallel (see, for example, Patent Document 1).

[Magnetization Fixed Layer A2]

The magnetization fixed layer A2 is a layer in which the magnetization is oriented in a first direction (for example, leftward in FIG. 2) and fixed. Here, the magnetization being fixed means that the magnetization direction does not change (the magnetization is fixed) before and after writing using a write current.

In the example shown in FIG. 2, the magnetization fixed layer A2 is an in-plane magnetization film whose magnetization has in-plane magnetic anisotropy (an in-plane easy magnetization axis). The magnetization fixed layer A2 is not limited to the in-plane magnetization film and may be a perpendicular magnetization film having perpendicular magnetic anisotropy (a perpendicular easy magnetization axis).

When the magnetization fixed layer A2 is an in-plane magnetization film, it has a high MR ratio (magnetoresistance change rate) and is hardly affected by a spin transfer torque (STT) during reading, and thus can increase the reading voltage. On the other hand, when it is desired to miniaturize the element, it is preferable to use a perpendicular magnetization film with a large magnetic anisotropy and a small demagnetizing field.

A known material can be used for the magnetization fixed layer A2. For example, a metal selected from the group consisting of Cr, Mn, Co, Fe, and Ni and an alloy that contains at least one of these metals and exhibits ferromagnetism can be used. An alloy containing these metals and at least one element of B, C, and N can also be used. Specific examples include Co—Fe and Co—Fe—B.

A Heusler alloy such as $Co_2FeSi$ can also be used for the magnetization fixed layer A2. The Heusler alloy includes an intermetallic compound having a chemical composition of $X_2YZ$, where X is a transition metal element or a noble metal element of Co, Fe, Ni or Cu groups in the periodic table, Y is a transition metal element of Mn, V, Cr or Ti groups, which may be of the same elemental species as X, and Z is a typical element of Groups III to V. Examples include $Co_2FeSi$, $Co_2MnSi$, and $Co_2Mn_{1-a}Fe_aAl_bSi_{1-b}$.

The magnetization fixed layer A2 may have a synthetic structure including a ferromagnetic layer and a nonmagnetic layer or a synthetic structure including an antiferromagnetic layer, a ferromagnetic layer, and a nonmagnetic layer. In the latter, the magnetization direction of the magnetization fixed layer A2 is strongly held by the antiferromagnetic layer in the synthetic structure. Therefore, the magnetization of the magnetization fixed layer A2 is hardly affected by the outside.

When the magnetization of the magnetization fixed layer A2 is oriented in the XY plane (the magnetization fixed layer A2 is an in-plane magnetization film), it is preferable to use, for example, NiFe. On the other hand, when the magnetization of the magnetization fixed layer A2 is oriented in the Z direction (the magnetization fixed layer A2 is a perpendicular magnetization film), it is preferable to use, for example, a Co/Ni laminated film or a Co/Pt laminated film. For example, when the magnetization fixed layer A2 is made of [Co(0.24 nm)/Pt(0.16 nm)]6/Ru(0.9 nm)/[Pt(0.16 nm)/Co (0.16 nm)]4/Ta(0.2 nm)/FeB(1.0 nm), this forms a perpendicular magnetization film.

[Nonmagnetic Layer A3]

The nonmagnetic layer A3 is disposed on a lower surface of the magnetization fixed layer A2. In the magnetoresistance effect element A, a change in the magnetization state of the magnetization free layer A1 with respect to the magnetization fixed layer A2 is read as a change in resistance value via the nonmagnetic layer A3. That is, the magnetization fixed layer A2, the nonmagnetic layer A3, and the magnetization free layer A1 function as the magnetoresistance effect element A. When the nonmagnetic layer A3 is made of an insulator, the configuration is similar to that of the tunnel magnetoresistance effect (TMR) element. When the nonmagnetic layer 2 is made of a metal, the configuration is similar to that of a giant magnetoresistance effect (GMR) element.

A known material that can be used for the nonmagnetic layer of the magnetoresistance effect element A can be used as a material of the nonmagnetic layer A3. When the nonmagnetic layer A3 is made of an insulator (i.e., when it is a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayer film or a mixed composition film of these materials, or the like can be used as a material of the nonmagnetic layer A3. Besides these materials, a material in which a part of Al, Si, or Mg is substituted with Zn, Be, or the like can also be used. Among these, MgO and $MgAl_2O_4$ can have a large magnetoresistance ratio (MR ratio) since these are materials capable of realizing coherent tunneling. On the other hand, when the nonmagnetic layer 2 is made of a metal, Cu, Al, Ag, or the like can be used as a material of the nonmagnetic layer A3.

When the nonmagnetic layer A3 is made of an insulator (i.e., when it is a tunnel barrier layer), the thickness thereof is, for example, 2.5 nm or more.

[Magnetization Free Layer A1]

The magnetization free layer A1 corresponds to a domain wall drive layer of a domain wall drive type (motion type) MRAM.

The magnetization free layer A1 is made of a ferromagnetic material and the magnetization direction inside thereof can be reversed. The magnetization free layer A1 has a first region A11 in which the magnetization is oriented in a second direction opposite to that of the magnetization fixed layer A2, a second region A12 in which the magnetization is oriented in the same direction as the first direction, and a domain wall DW that forms the interface between these regions. The magnetization directions of the first region A11 and the second region A12 are opposite to each other across the domain wall DW. The domain wall DW is moved by changing the composition ratio of the first region A11 and the second region A12 in the magnetization free layer A1.

A known material can be used as a material of the magnetization free layer A1 and in particular a soft magnetic material can be applied. For example, a metal selected from the group consisting of Cr, Mn, Co, Fe, and Ni, an alloy containing at least one of these metals, an alloy containing these metals and at least one element of B, C, and N, or the like can be used. Specific examples of the material for the magnetization free layer Al include Co—Fe, Co—Fe—B, and Ni—Fe.

A material having a small saturation magnetization can be used as a material of the magnetization free layer A1. For example, when a material having a small saturation magnetization such as (MnGa)As or (InFe)As or a Co/Tb multilayer film or GdFeCo is used, the domain wall DW of the magnetization free layer A1 can be driven with a small current density. Moreover, when these materials are used, the drive speed of the domain wall DW becomes slow.

A material with weak magnetic anisotropy such as NiFe gives a high drive speed to the domain wall DW and allows the domain wall DW to operate at a speed of 100 m/sec or more. That is, the domain wall DW moves a distance of 1 μm with a pulse of 10 nsec. Accordingly, to move the magnetization free layer A1 in an analog manner in the element, it is necessary to take measures such as applying a minute pulse using an expensive semiconductor circuit or making the magnetization free layer sufficiently long at the expense of the degree of integration. On the other hand, a material with a slow drive speed for the domain wall DW can form an analog memory even when a sufficiently long pulse current is applied or when the length of the magnetization free layer A1 is short.

When the magnetization free layer A1 is a perpendicular magnetization film, it is preferable that a perpendicular magnetization film selected from the group consisting of a Co/Pt multilayer film, a Co/Pd multilayer film, and a CoCrPt alloy film be used. A perpendicular magnetization film of $Mn_3X$ (X=Ga, Ge) or a perpendicular magnetization film using a multilayer film of Co/Ni or the like can also be used. These materials allow the domain wall DW to be driven even when the current density for driving the domain wall is small.

It is preferable that the extension length of the magnetization free layer A1 in the longitudinal direction be 60 nm or more. If the extension length of the magnetization free layer A1 is less than 60 nm, it tends to form a single magnetic domain and it is difficult to form a domain wall DW in the magnetization free layer A1.

The thickness of the magnetization free layer A1 is not particularly limited as long as it functions as a domain wall drive layer, and may be, for example, 2 to 60 nm. When the thickness of the magnetization free layer A1 is 60 nm or more, the possibility that a domain wall is formed in the stacking direction increases. However, whether or not a domain wall is formed in the stacking direction depends on a balance with the shape anisotropy of the magnetization free layer A1. If the thickness of the magnetization free layer A1 is less than 60 nm, it is unlikely that such a domain wall DW will be formed in the stacking direction.

The magnetization free layer A1 may have a domain wall pinning portion which stops movement of the domain wall DW on a side of the layer. For example, by providing irregularities, a groove, a bulge, a constriction, a cutout, or the like at a position where it is desired to stop the movement of the domain wall DW of the magnetization free layer A1, it is possible to stop (pin) the movement of the domain wall. When the magnetization free layer A1 has a domain wall pinning portion, this can be configured such that the domain wall no longer moves unless a current of a threshold value or more flows, and the output signal is not analog and can be easily multi-valued.

For example, by forming domain wall pinning portions at intervals of a predetermined distance, the domain wall DW can be held more stably, enabling stable multi-valued recording and also enabling more stable reading of multi-valued output signals.

In the example shown in FIG. 2, in order to form the domain wall DW, a first magnetization supply layer A4 having a magnetization in the first direction which is the same as the magnetization of the first region A11 and a second magnetization supply layer A5 having a magnetization in the second direction which is the same as the magnetization of the second region A12 are formed on both end portions of the magnetization free layer A1 that do not overlap the magnetization fixed layer A2 in plan view.

The same material as the ferromagnetic material that can be used for the magnetization fixed layer A2 can be used as a material of the first magnetization supply layer A4 and the second magnetization supply layer A5.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a spin orbit torque (SOT) wiring that is in contact with the magnetization free layer A1 and extends in a direction crossing the longitudinal direction of the magnetization free layer A1 may also be used for one or both end portions. The spin orbit torque wiring is made of a material that generates a pure spin current by the spin Hall effect when a current flows.

With this configuration, a domain wall can be introduced into the magnetization free layer A1 by flowing a current through both ends of the spin orbit torque wiring without providing a magnetization supply layer as a layer with fixed magnetization. The domain wall can be moved by flowing a current through the magnetization free layer A1 via the spin orbit torque wiring.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a magnetic field application wiring that is electrically insulated from the magnetization free layer A1 and extends in a direction crossing the magnetization free layer A1 may be used for one or both end portions. A magnetic field is generated by Ampere's law by flowing a current through the magnetic field application wiring. The direction of the generated magnetic field can be reversed with the direction of the current flowing through the magnetic field application wiring. Therefore, by disposing a magnetic field application wiring capable of supplying an in-plane magnetization to an end portion of the magnetization free layer A1, an in-plane magnetization with one of the in-plane magnetization directions that are opposite to each other can be supplied to the end portion of the magnetization free layer A1 according to the direction of a current flowing through the magnetic field application wiring. In addition, by disposing a magnetic field application wiring capable of supplying a perpendicular magnetization to an end portion of the magnetization free layer A1, a perpendicular magnetization with one of the perpendicular magnetization directions that are opposite to each other can be supplied to the end portion of the magnetization free layer A1 according to the direction of a current flowing through the magnetic field application wiring.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a voltage application terminal that is connected to the magnetization free layer A1 via an insulating layer may be used for one or both end portions. When a voltage is applied between the magnetization fixed layer A2 and the voltage application terminal, a part of the magnetization of the magnetization free layer A1 is affected by the voltage. For example, when a voltage is applied as a pulse from the voltage application terminal, a part of the magnetization is oriented in a direction perpendicular to the magnetization direction of the magnetization free layer A1 during the voltage application and the magnetization of the magnetization free layer A1 is oriented in a first direction or a second direction opposite thereto when the voltage application has stopped. The magnetization oriented in the perpendicular direction falls into the first direction or the second direction opposite thereto with equal probabilities. Thus, by adjusting the timing, the number of times, and the period of applying the pulsed voltage, a part of the magnetization can become oriented into the second direction from the first direction.

A magnetic coupling layer may be provided between the magnetization free layer A1 and the nonmagnetic layer A3. The magnetic coupling layer is a layer that transfers the magnetization state of the magnetization free layer A1. A main function of the magnetization free layer A1 is being a layer for driving the domain wall and it is not always possible to select a material suitable for the magnetoresistance effect generated through the magnetization fixed layer A1 and the nonmagnetic layer A2. In general, it is known that a ferromagnetic material having a BCC structure is good for the magnetization fixed layer A1 and the magnetic coupling layer to generate a coherent tunnel effect using the nonmagnetic layer A2. In particular, it is known that a large output can be obtained when a material having a composition of Co—Fe—B is formed through sputtering as a material of the magnetization fixed layer A1 and the magnetic coupling layer.

Figure 3:
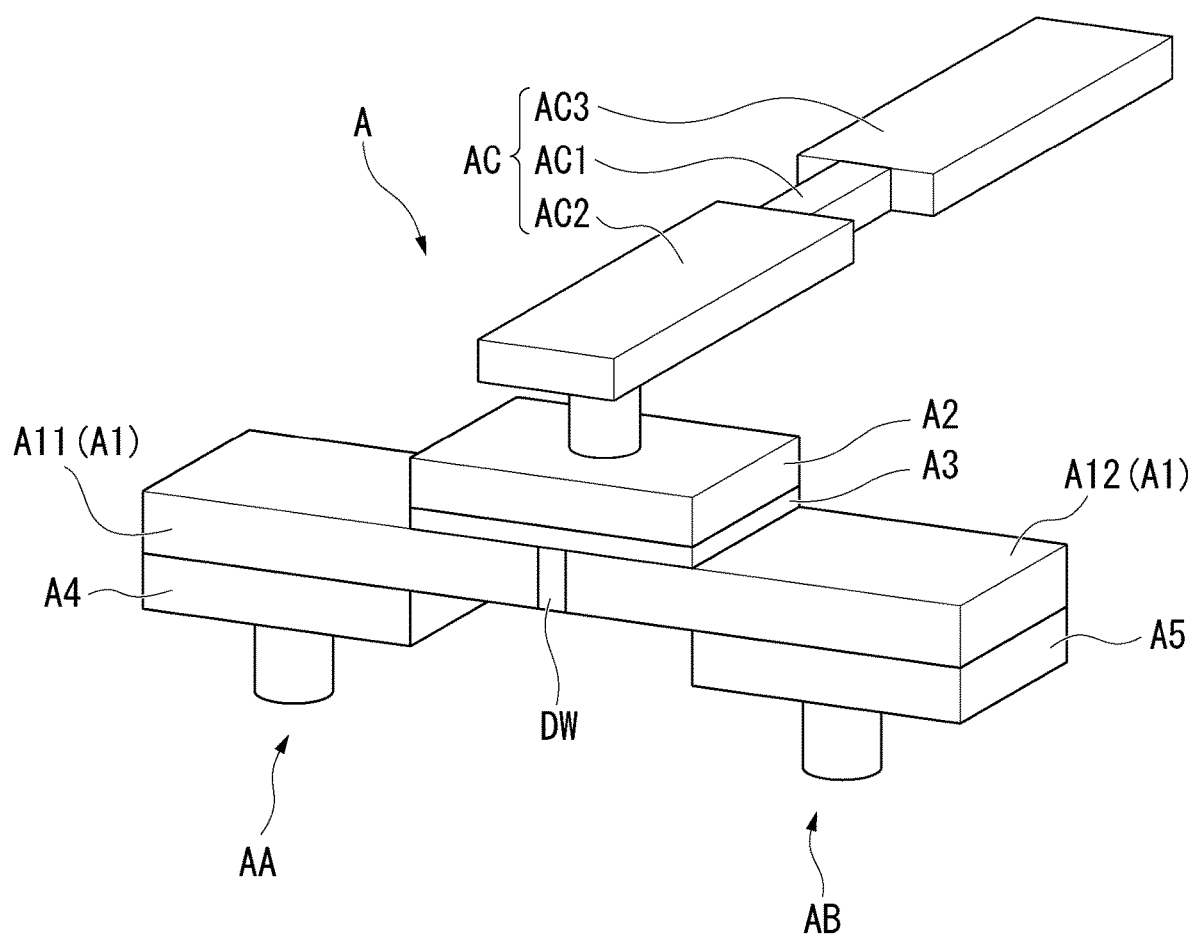
FIG. 3 is a perspective view showing a first example of a resistance change element applicable as a fixed-input product operation element of the product-sum operation device of the first embodiment.

FIG. 3 is a perspective view showing a first example of a resistance change element applicable as each of the fixed-input product operation elements 10A2A, 10A2B, 10B2A, and 10B2B of the product-sum operation device 1 of the first embodiment.

In the example shown in FIG. 3, the resistance change element is a magnetoresistance effect element A exhibiting a magnetoresistance effect.

The magnetoresistance effect element A includes a magnetization free layer A1 having a domain wall DW, a magnetization fixed layer A2 whose magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the domain wall DW and a second region A12 on the other side of the domain wall DW. The first region A11 is disposed with a write terminal AA. The second region A12 is disposed with a common terminal AB. The magnetization fixed layer A2 is disposed with a read terminal AC.

In the example shown in FIG. 3, the read terminal AC includes a fuse portion AC1 and wiring portions AC2 and AC3 disposed on both sides of the fuse portion AC1. When an output current from the magnetoresistance effect element A is output via the read terminal AC, the output current flows through the fuse portion AC1 and wiring portions AC2 and AC3 in the order of the wiring portion AC2, the fuse portion AC1, and the wiring portion AC3 (that is, upward in FIG. 3) or flows through the fuse portion AC1 and the wiring portions AC2 and AC3 in the order of the wiring portion AC3, the fuse portion AC1, and the wiring portion AC2 (that is, downward in FIG. 3).

In the example shown in FIG. 3, the cross-sectional area of the fuse portion AC1 perpendicular to the direction in which the output current flows is set smaller than the cross-sectional area of the wiring portions AC2 and AC3 perpendicular to the direction in which the output current flows.

That is, the fuse portion AC1 is configured to be more easily disconnected than the wiring portions AC2 and AC3.

In the example shown in FIG. 3, the fuse portion AC1 is configured to be more easily disconnected than the wiring portions AC2 and AC3 by making the cross-sectional area of the fuse portion AC1 smaller than the cross-sectional area of the wiring portions AC2 and AC3. However, in another example, the fuse portion AC1 may be configured to be more easily disconnected than the wiring portions AC2 and AC3 by forming the fuse portion AC1 in a meander shape or in a mesh shape.

In still another example, the fuse portion AC1 may be configured to be more easily disconnected than the wiring portions AC2 and AC3 by making the melting point of the material of the fuse portion AC1 lower than the melting point of the material of the wiring portions AC2 and AC3.

In the example shown in FIG. 3, the fuse portion AC1 is disposed closer to the read terminal AC (on the upper side in FIG. 3) than the magnetization fixed layer A2 is. Therefore, it is possible to curb the possibility that the write terminal AA side may be affected by the disconnection of the fuse portion AC1.

That is, in the example shown in FIG. 3, the fixed-input product operation elements 10A2A, 10A2B, 10B2A, and 10B2B (magnetoresistance effect element A) have a function of being disconnected when an output current increase malfunction has occurred.

Figure 4:
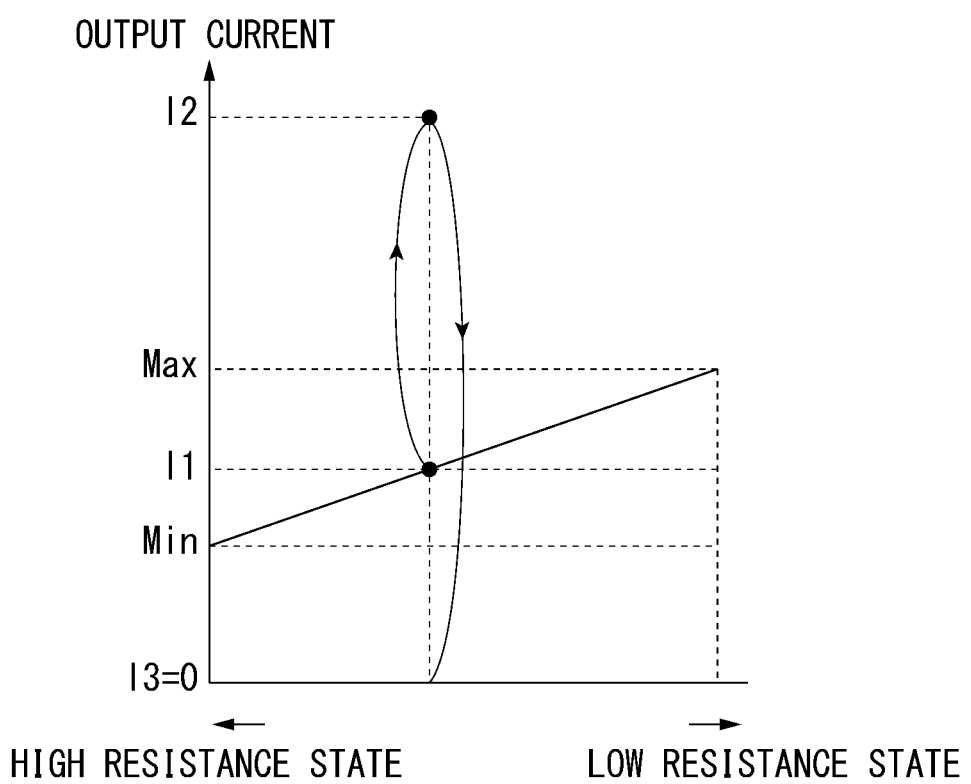

FIG. 4 is a diagram showing changes in the output current from the magnetoresistance effect element A via the read terminal AC shown in FIG. 3 and the like. In FIG. 4, the vertical axis indicates the output current from the magnetoresistance effect element A via the read terminal AC. The horizontal axis indicates the state (the magnitude of the resistance value) of the magnetoresistance effect element A.

When the magnetoresistance effect element A operates normally and the resistance value of the magnetoresistance effect element A is the highest, the output current from the magnetoresistance effect element A via the read terminal AC is a minimum value Min.

When the magnetoresistance effect element A operates normally, the output current from the magnetoresistance effect element A via the read terminal AC increases as the resistance value of the magnetoresistance effect element A decreases.

When the magnetoresistance effect element A operates normally and the resistance value of the magnetoresistance effect element A is the lowest, the output current from the magnetoresistance effect element A via the read terminal AC is a maximum value Max.

In the example shown in FIG. 4, when the magnetoresistance effect element A operates normally, the output current from the magnetoresistance effect element A via the read terminal AC becomes a value I1.

When a malfunction which increases the output current from the magnetoresistance effect element A via the read terminal AC has occurred in the magnetoresistance effect element A, the output current from the magnetoresistance effect element A via the read terminal AC increases as indicated by an upward arrow in FIG. 4.

In the example shown in FIG. 4, when the output current from the magnetoresistance effect element A via the read terminal AC increases to a value I2, the fuse portion AC1 of the read terminal AC of the magnetoresistance effect element A is disconnected. As a result, the output current from the magnetoresistance effect element A via the read terminal AC decreases to a value I3 (specifically, decreases to zero) as indicated by a downward arrow in FIG. 4.

That is, in the example shown in FIG. 4, the output current from the magnetoresistance effect element A via the read terminal AC after the fuse portion AC1 is disconnected is smaller than the output current from the magnetoresistance effect element A via the read terminal AC during normal operation of the magnetoresistance effect element A.

Figure 5:
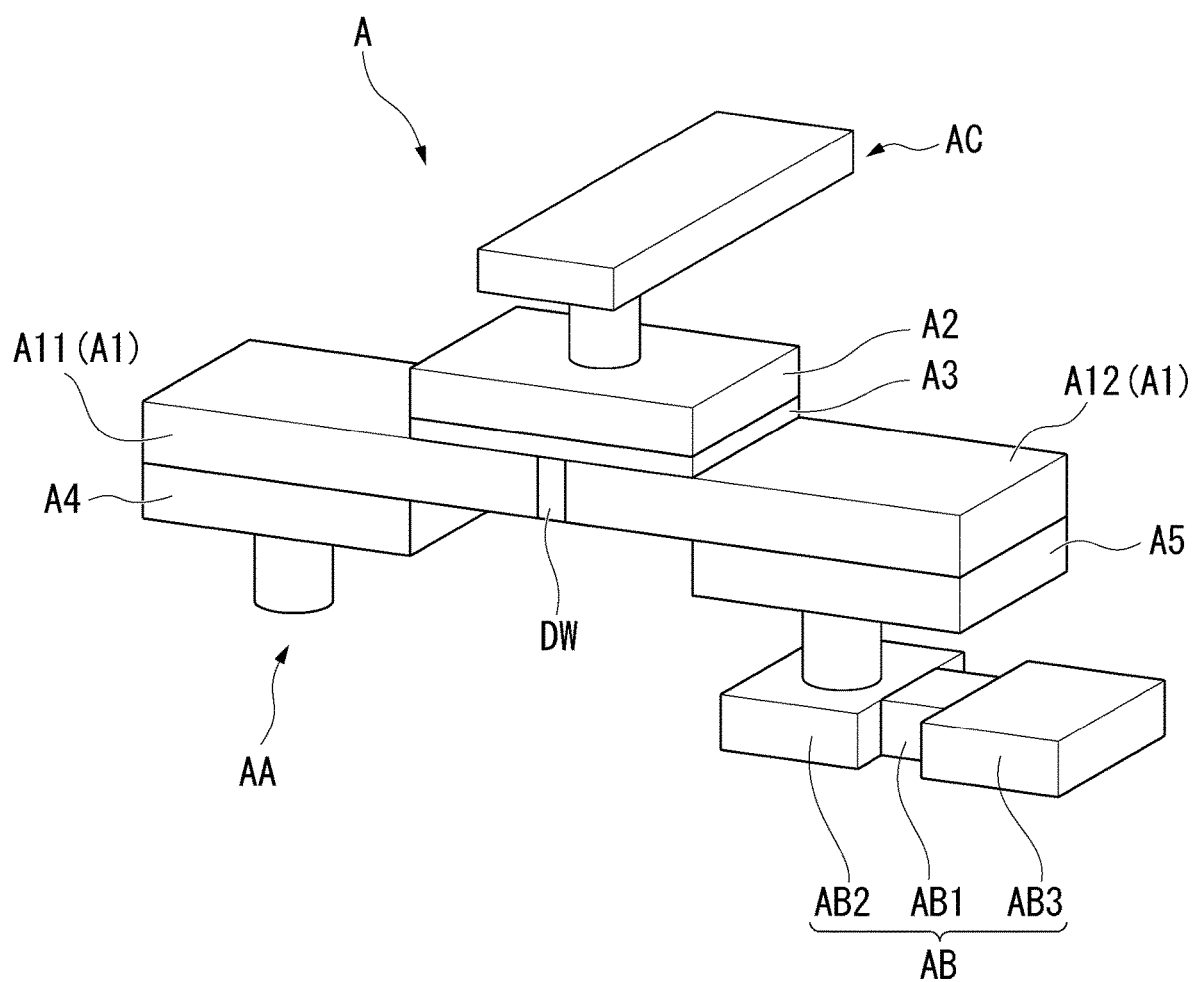
FIG. 5 is a perspective view showing a second example of a resistance change element applicable as a fixed-input product operation element of the product-sum operation device of the first embodiment.

FIG. 5 is a perspective view showing a second example of a resistance change element applicable as each of the fixed-input product operation elements 10A2A, 10A2B, 10B2A, and 10B2B of the product-sum operation device 1 of the first embodiment.

In the example shown in FIG. 5, the resistance change element is a magnetoresistance effect element A exhibiting a magnetoresistance effect, similar to the example shown in FIG. 3.

In the example shown in FIG. 5, a common terminal AB includes a fuse portion AB1 and wiring portions AB2 and AB3 disposed on both sides of the fuse portion AB1, unlike the example shown in FIG. 3. When an output current from the magnetoresistance effect element A is output via the common terminal AB, the output current flows through the fuse portion AB1 and the wiring portions AB2 and AB3 in the order of the wiring portion AB2, the fuse portion AB1, and the wiring portion AB3 (that is, rightward in FIG. 5) or flows through the fuse portion AB1 and the wiring portions AB2 and AB3 in the order of the wiring portion AB3, the fuse portion AB1, and the wiring portion AB2 (that is, leftward in FIG. 5).

In the example shown in FIG. 5, the cross-sectional area of the fuse portion AB1 perpendicular to the direction in which the output current flows is set smaller than the cross-sectional area of the wiring portions AB2 and AB3 perpendicular to the direction in which the output current flows.

That is, the fuse portion AB1 is configured to be more easily disconnected than the wiring portions AB2 and AB3.

In the example shown in FIG. 5, the fuse portion AB1 is configured to be more easily disconnected than the wiring portions AB2 and AB3 by making the cross-sectional area of the fuse portion AB1 smaller than the cross-sectional area of the wiring portions AB2 and AB3. However, in another example, the fuse portion AB1 may be configured to be more easily disconnected than the wiring portions AB2 and AB3 by forming the fuse portion AB1 in a meander shape or in a mesh shape.

In still another example, the fuse portion AB1 may be configured to be more easily disconnected than the wiring portions AB2 and AB3 by making the melting point of the material of the fuse portion AB1 lower than the melting point of the material of the wiring portions AB2 and AB3.

That is, in the example shown in FIG. 5, the fixed-input product operation elements 10A2A, 10A2B, 10B2A, and 10B2B (magnetoresistance effect element A) have a function of being disconnected when an output current increase malfunction has occurred, similar to the example shown in FIG. 3.

Figure 6:
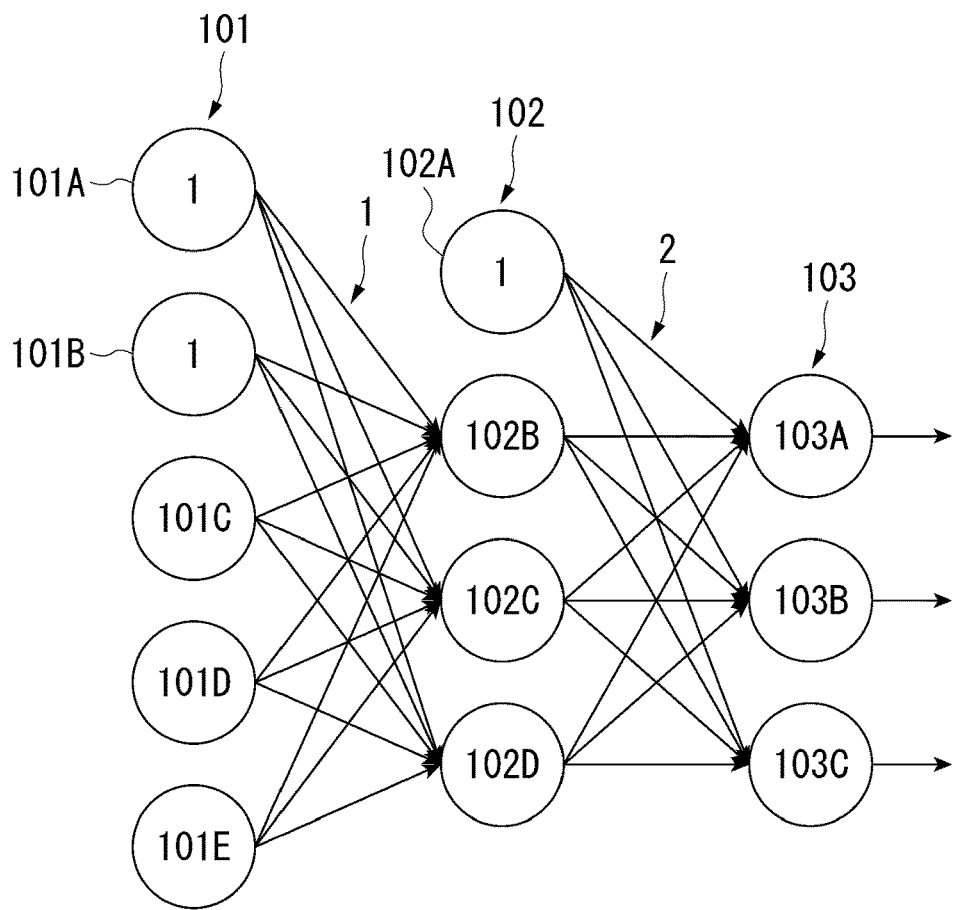
FIG. 6 is a diagram showing an exemplary application of the product-sum operation device of the first embodiment.
Figure 7:
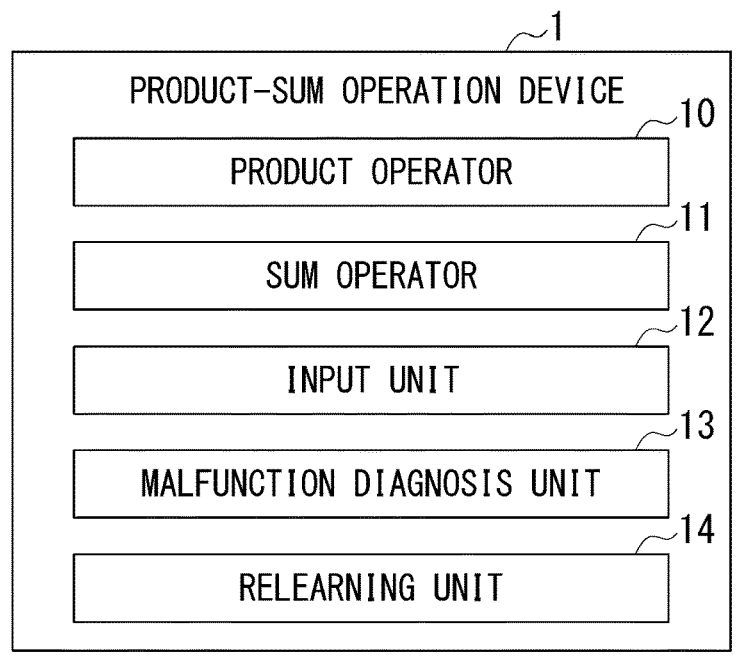
FIG. 7 is a diagram showing an example of the overall configuration of the product-sum operation device of the first embodiment.

FIG. 6 is a diagram showing an exemplary application of the product-sum operation device 1 of the first embodiment, which also shows an exemplary application to a network called a multilayer perceptron of 3-3-3. FIG. 7 is a diagram showing an example of the overall configuration of the product-sum operation device 1 of the first embodiment.

In the example shown in FIG. 6, the product-sum operation device 1 of the first embodiment is applied to the neuromorphic device 100. The neuromorphic device 100 includes an input layer 101, a hidden layer 102, an output layer 103, the product-sum device 1 of the first embodiment, and a product-sum calculation device 2. The product-sum operation device 1 of the first embodiment includes a plurality (three) of variable-input product operation elements and a plurality (two) of fixed-input product operation elements. On the other hand, the product-sum operation device 2 includes a plurality (three) of variable-input product operation elements and one fixed-input product operation element.

The input layer 101 includes, for example, five nodes 101A, 101B, 101C, 101D, and 101E. Among these, the nodes 101A and 101B correspond to the fixed input units shown in FIG. 1 and are set to 1. The hidden layer 102 includes, for example, four nodes 102A, 102B, 102C, and 102D. Among these, the node 102A is set to 1. The output layer 103 includes, for example, three nodes 103A, 103B, and 103C.

The product-sum operation device 1 is disposed between the input layer 101 and the hidden layer 102 and connects the four nodes 101A, 101B, 101C, and 101D of the input layer 101 and the three nodes 102A, 102B, and 102C of the hidden layer 102. In the product-sum operation device 1 shown in FIG. 1, the fixed-input product operators 10A2A and the like as shown in FIG. 1 are connected between the nodes 101A and 101B of the input layer 101 and the nodes 102B to 102D of the hidden layer 102, and the sum of an input signal multiplied by a weight and a bias (hereinafter referred to as a constant "b1") is output to each node of the hidden layer 102.

The product-sum operation device 2 is disposed between the hidden layer 102 and the output layer 103. The product-sum operation device 2 is not a product-sum operation device of the present invention because the product-sum operation device 2 does not include a plurality of fixed-input product operation elements (includes one) although it includes a plurality (three) of variable-input product operation elements.

The hidden layer 102 uses, for example, an activation function (for example, a sigmoid function).

In intensive studies, the present inventor has found that, by introducing a bias term when performing a product-sum operation in a neural network device, it is possible to improve the discrimination performance of the neural network.

Specifically, the present inventor has found that a product-sum operation device in which resistance change elements are used as a plurality of product operation elements may use a fixed-input product operation element to express a bias term.

Further, the present inventor has found that the influence of a malfunction of a fixed-input product operation element expressing a bias term upon the discrimination performance of the neural network is greater than the influence of a malfunction of a variable-input product operation element expressing a weight upon the discrimination performance of the neural network.

This is because the value of "weight" is generally set for each specific combination, whereas the bias term is used to bias all values of the layer. If current concentrates on the malfunctioning product operation element (resistance change element) of the bias term and thus a large amount of current flows in it, weights of the other product operation elements (currents from the other product operation elements) may ignored in the circuit.

In addition, the present inventor has found that, by providing a plurality of fixed-input product operation elements expressing a bias term in one column, it is possible to prevent total loss of the discrimination performance of the neural network and curb a reduction in the discrimination performance of the neural network when one fixed-input product operation element has malfunctioned.

In view of this point, in the product-sum operation device 1 of the first embodiment, the column 10A is provided with a plurality of fixed-input product operation elements 10A2A and 10A2B and the column 10B is provided with a plurality of fixed-input product operation elements 10B2A and 10B2B as shown in FIG. 1. Further, the product-sum operation device 1 of the first embodiment includes a malfunction diagnosis unit 13 as shown in FIG. 7.

The present inventor has also found that, even when one fixed-input product operation element has malfunctioned among a plurality of fixed-input product operation elements provided in one column, the discrimination performance of the network can be recovered by performing relearning.

In view of this point, the product-sum operation device 1 of the first embodiment includes a relearning unit 14 as shown in FIG. 7.

Figure 8:
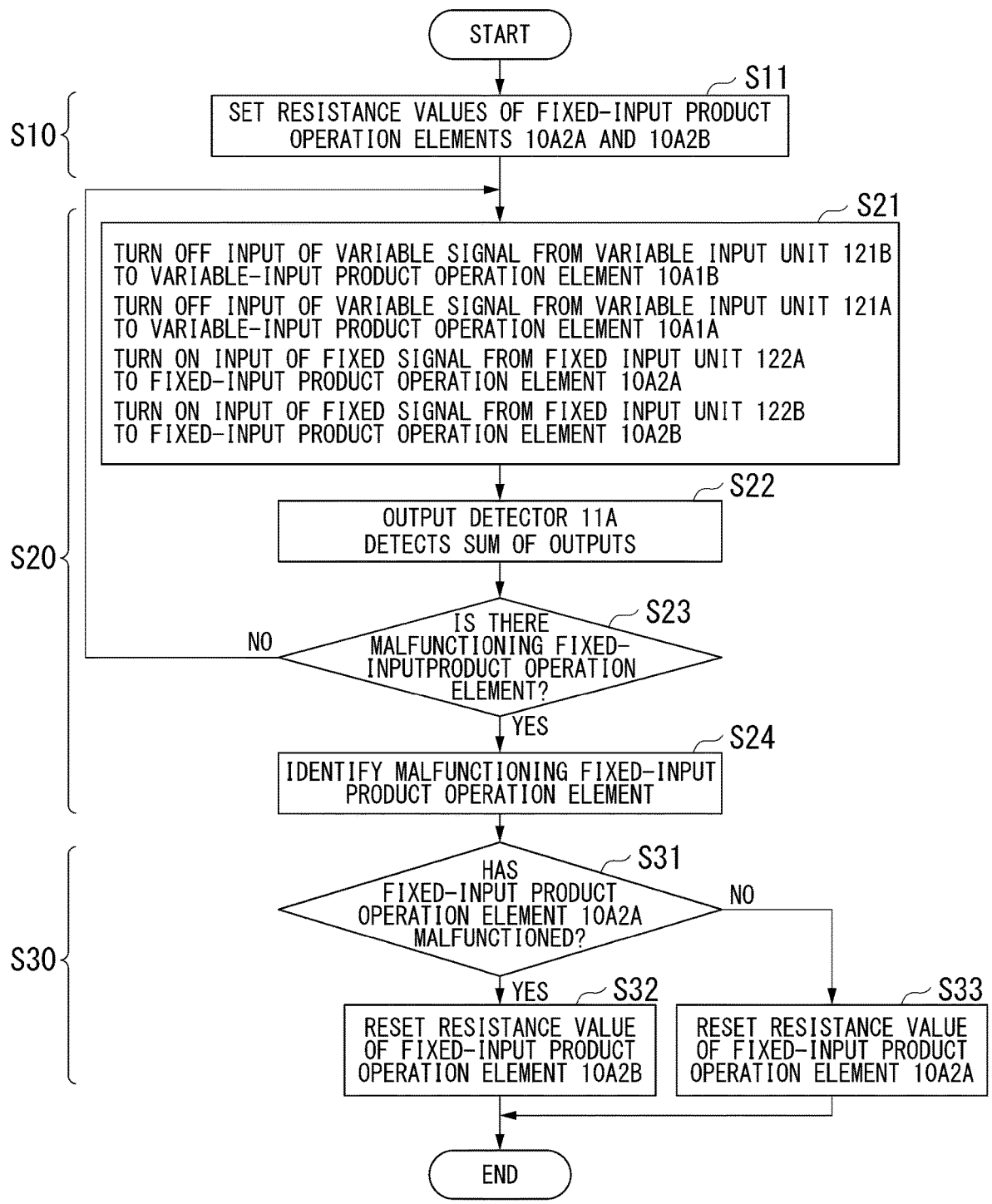
FIG. 8 is a flowchart showing an example of a process executed by the product-sum operation device of the first embodiment shown in FIGS. 1 and 7.

FIG. 8 is a flowchart showing an example of a process executed by the product-sum operation device 1 of the first embodiment shown in FIGS. 1 and 7.

In the example shown in FIG. 8, the product-sum operation device 1 executes a learning step S10, a malfunction diagnosis step S20, and a relearning step S30 (relearning process). The learning step S10 includes step S11. The malfunction diagnosis step S20 includes steps S21 to S24. The relearning step S30 includes steps S31 to S33.

In the learning step S10, for example, known back-propagation learning is performed. Specifically, in step S11, the product-sum operation device 1 sets resistance values of the fixed-input product operation elements 10A2A and 10A2B that express the bias term of the column 10A.

Next, the malfunction diagnosis unit 13 of the product-sum operation device 1 executes the malfunction diagnosis step S20. Specifically, in step S21, the product-sum operation device 1 turns off the input of a variable signal from the variable input unit 121A to the variable-input product operation element 10A1A (and the variable-input product operation element 10B1A). That is, the variable signal from the variable input unit 121A is not input to the variable-input product operation element 10A1A.

In step S21, the product-sum operation device 1 turns off the input of a variable signal from the variable input unit 121B to the variable-input product operation element 10A1B (and the variable-input product operation element 10B1B). That is, the variable signal from the variable input unit 121B is not input to the variable-input product operation element 10A1B.

In step S21, the product-sum operation device 1 turns on the input of a fixed signal from the fixed input unit 122A to the fixed-input product operation element 10A2A (and the fixed-input product operation element 10B2A). That is, a fixed signal is input from the fixed input unit 122A to the fixed-input product operation element 10A2A.

In step S21, the product-sum operation device 1 turns on the input of a fixed signal from the fixed input unit 122B to the fixed-input product operation element 10A2B (and the fixed-input product operation element 10B2B). That is, a fixed signal is input from the fixed input unit 122B to the fixed-input product operation element 10A2B.

Next, in step S22 (output detection process), the output detector 11A detects the sum of outputs from the variable-input product operation elements 10A1A and 10A1B and the fixed-input product operation elements 10A2A and 10A2B. As described above, a variable signal from the variable input unit 121A is not input to the variable-input product operation element 10A1A and a variable signal from the variable input unit 121B is not input to the variable-input product operation element 10A1B. Therefore, the outputs from the variable-input product operation elements 10A1A and 10A1B are zero.

That is, in step S22 (output detection process), the output detector 11A detects the sum of outputs from the fixed-input product operation elements 10A2A and 10A2B in a state in which the variable input units 121A and 121B do not input variable signals to the variable-input product operation elements 10A1A and 10A1B and the fixed input units 122A and 122B input a fixed signal to the fixed-input product operation elements 10A2A and 10A2B.

Next, in step S23 (diagnosis process), the malfunction diagnosis unit 13 determines whether or not a malfunctioning fixed-input product operation element is included in the fixed-input product operation elements 10A2A and 10A2B on the basis of a detection value of the output detector 11A. When no malfunctioning fixed-input product operation element is included in the fixed-input product operation elements 10A2A and 10A2B, the process returns to step S21.

On the other hand, when a malfunctioning fixed-input product operation element is included in the fixed-input product operation elements 10A2A and 10A2B, the process proceeds to step S24.

In step S24, the product-sum operation device 1 identifies a malfunctioning fixed-input product operation element among the fixed-input product operation elements 10A2A and 10A2B.

In step S24, to determine whether or not the fixed-input product operation element 10A2A has malfunctioned, for example, the output detector 11A detects an output from the fixed-input product operation element 10A2A in a state in which the variable input units 121A and 121B do not input variable signals to the variable-input product operation elements 10A1A and 10A1B, the fixed input unit 122B does not input a fixed signal to the fixed-input product operation element 10A2B, and the fixed input unit 122A inputs a fixed signal to the fixed-input product operation element 10A2A. Then, the malfunction diagnosis unit 13 determines whether or not the fixed-input product operation element 10A2A has malfunctioned on the basis of the detection value of the output detector 11A.

Similarly, in step S24, to determine whether or not the fixed-input product operation element 10A2B has malfunctioned, for example, the output detector 11A detects an output from the fixed-input product operation element 10A2B in a state in which the variable input units 121A and 121B do not input variable signals to the variable-input product operation elements 10A1A and 10A1B, the fixed input unit 122A does not input a fixed signal to the fixed-input product operation element 10A2A, and the fixed input unit 122B inputs a fixed signal to the fixed-input product operation element 10A2B. Then, the malfunction diagnosis unit 13 determines whether or not the fixed-input product operation element 10A2B has malfunctioned on the basis of the detection value of the output detector 11A.

Next, the relearning unit 14 of the product-sum operation device 1 executes the relearning step S30 (relearning process). In the relearning step S30, for example, known back-propagation learning is performed. Specifically, in step S31, the relearning unit 14 determines whether or not the fixed-input product operation element 10A2A has malfunctioned on the basis of the diagnosis result of step S24 described above. When the fixed-input product operation element 10A2A has malfunctioned, the process proceeds to step S32. On the other hand, when the fixed-input product operation element 10A2B has malfunctioned, the process proceeds to step S33.

In step S32, the relearning unit 14 resets the resistance value of the fixed-input product operation element 10A2B such that the bias term of the column 10A is expressed by the fixed-input product operation element 10A2B alone.

That is, in step S32, the relearning unit 14 resets the resistance value of the fixed-input product operation element 10A2B other than the malfunctioning fixed-input product operation element 10A2A among the fixed-input product operation elements 10A2A and 10A2B.

In step S33, the relearning unit 14 resets the resistance value of the fixed-input product operation element 10A2A such that the bias term of the column 10A is expressed by the fixed-input product operation element 10A2A alone.

That is, in step S33, the relearning unit 14 resets the resistance value of the fixed-input product operation element 10A2A other than the malfunctioning fixed-input product operation element 10A2B among the fixed-input product operation elements 10A2A and 10A2B.

Figure 9:
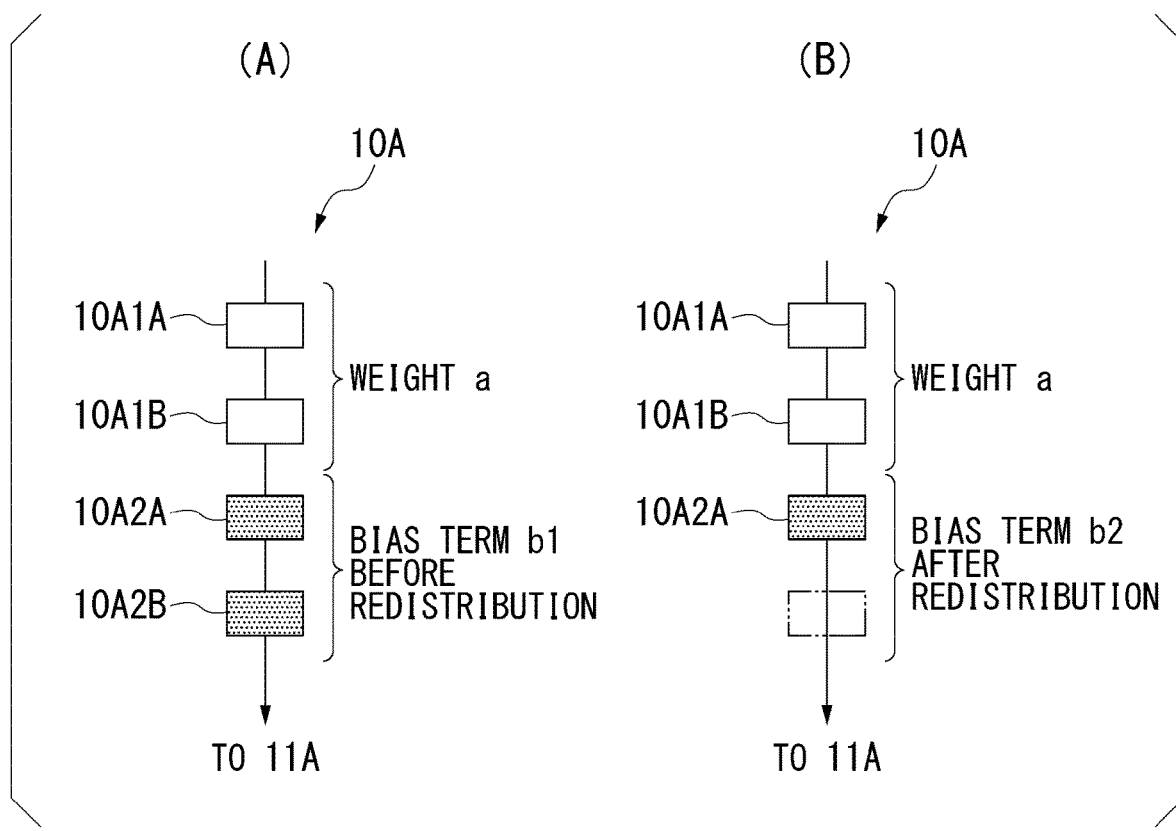
FIG. 9 is a diagram showing an example in which the resistance value of a fixed-input product operation element is reset in step S33 of FIG. 8.

FIG. 9A and FIG. 9B are diagrams showing an example in which the resistance value of the fixed-input product operation element 10A2A is reset in step S33 of FIG. 8. Specifically, FIG. 9A shows a state before the fixed-input product operation element 10A2B malfunctions. FIG. 9B shows a state after the fixed-input product operation element 10A2B has malfunctioned and the resistance value of the fixed-input product operation element 10A2A has been reset.

In the example shown in FIGS. 9A and 9B, when the product-sum operation device 1 of the first embodiment is applied to a neural network, weights a are set by the resistance values of the variable-input product operation elements 10A1A and 10A1B. Before the fixed-input product operation element 10A2B malfunctions, a bias term b1 is set by the resistance values of the fixed-input product operation elements 10A2A and 10A2B as shown in FIG. 9A. After the fixed-input product operation element 10A2B malfunctions, the relearning unit 14 resets the resistance value of the fixed-input product operation element 10A2A in step S33 described above. As a result, as shown in FIG. 9B, a bias term b2 is set by the resistance value of the fixed-input product operation element 10A2A alone. That is, in the example shown in FIG. 9A and FIG. 9B, when the fixed-input product operation element 10A2B has malfunctioned, the bias term b2 redistributed to the fixed-input product operation element 10A2A other than the fixed-input product operation element 10A2B among the fixed-input product operation elements 10A2A and 10A2B is set.

That is, in the product-sum operation device 1 of the first embodiment, the fixed-input product operation elements 10A2A and 10A2B, to which a determined signal is input in synchronization with variable signals input to the variable-input product operation elements 10A1A and 10A1B, function as a bias term. When the product-sum operation device 1 of the first embodiment is applied to a neural network, the discrimination performance of the neural network can be improved as compared to when a product-sum operation device in which fixed-input product operation elements 10A2A and 10A2B are not used as bias term elements is applied to a neural network.

As described above, for example, the product-sum operation device 1 of the first embodiment shown in FIG. 1 includes the product operator 10 and the sum operator 11. The product operator 10 includes a plurality of variable-input product operation elements 10A1A and 10A1B and a plurality of fixed-input product operation elements 10A2A and 10A2B. Each of the plurality of variable-input product operation elements 10A1A and 10A1B and the plurality of fixed-input product operation elements 10A2A and 10A2B is a resistance change element. The product-sum operation device 1 of the first embodiment further includes the variable input units 121A and 121B that input variable signals to a plurality of variable-input product operation elements 10A1A, 10A1B, . . . , and the fixed input units 122A and 122B that input a determined signal to the plurality of fixed-input product operation elements 10A2A and 10A2B in synchronization with the variable signals. The sum operator 11 includes the output detector 11A that detects the sum of outputs from the plurality of variable-input product operation elements 10A1A and 10A1B and outputs from the plurality of fixed-input product operation elements 10A2A and 10A2B.

Therefore, when the product-sum operation device 1 of the first embodiment is applied to a neural network, it is possible to curb a reduction in the performance of the neural network when one of the fixed-input product operation elements 10A2A and 10A2B which are bias term elements has malfunctioned.

In the product-sum operation device 1 of the first embodiment, as described above, the plurality of fixed-input product operation elements 10A2A and 10A2B have a function of being disconnected (that is, a function of having the resistance value becoming infinite) when an output current increase malfunction has occurred. Each of the plurality of variable-input product operation elements 10A1A and 10A1B and the plurality of fixed-input product operation elements 10A2A and 10A2B is a magnetoresistance effect element A that includes a write terminal AA, a common terminal AB, and a read terminal AC and exhibits a magnetoresistance effect. The magnetoresistance effect element A includes a magnetization free layer A1 having a domain wall DW, a magnetization fixed layer A2 whose magnetization direction is fixed, and a nonmagnetic layer A3 sandwiched between the magnetization free layer A1 and the magnetization fixed layer A2.

That is, in the product-sum operation device 1 of the first embodiment, elements with a great difference between the resistance value during normal operation and the resistance value during a malfunction (specifically, during a malfunction of the output current increasing such that they are disconnected) are used as the plurality of fixed-input product operation elements 10A2A and 10A2B.

Therefore, according to the product-sum operation device 1 of the first embodiment, it is possible to curb a reduction in the performance of the neural network when one of the fixed-input product operation elements 10A2A and 10A2B has malfunctioned as compared to when elements with a small difference between the resistance value during normal operation and the resistance value during malfunction are used as fixed-input product operation elements.

Further, when the product-sum operation device 1 of the first embodiment is used (specifically, at the time of output inspection), the output detector 11A detects outputs from the plurality of fixed-input product operation elements 10A2A and 10A2B in a state in which the variable input units 121A and 121B do not input variable signals to the plurality of variable-input product operation elements 10A1A and 10A1B and the fixed input units 122A and 122B input a fixed signal to the plurality of fixed-input product operation elements 10A2A and 10A2B.

Further, when the product-sum operation device 1 of the first embodiment is used (specifically, at the time of diagnosis), the malfunction diagnosis unit 13 determines whether or not a malfunctioning fixed-input product operation element is included in the plurality of fixed-input product operation elements 10A2A and 10A2B on the basis of the outputs from the plurality of fixed-input product operation elements 10A2A and 10A2B detected at the time of the output detection.

Therefore, according to the product-sum operation device 1 of the first embodiment, it is possible to curb a reduction in the performance of the neural network when one of the fixed-input product operation elements 10A2A and 10A2B has malfunctioned as compared to when such output inspection and diagnosis are not performed.

Further, when the product-sum operation device 1 of the first embodiment is used (specifically, at the time of relearning) in the case where a malfunctioning fixed-input product operation element is included in the plurality of fixed-input product operation elements 10A2A and 10A2B, the relearning unit 14 resets the resistance value of a fixed-input product operation element other than the malfunctioning fixed-input product operation element among the plurality of fixed-input product operation elements 10A2A and 10A2B.

Therefore, according to the product-sum operation device 1 of the first embodiment, it is possible to curb a reduction in the performance of the neural network when one of the fixed-input product operation elements 10A2A and 10A2B has malfunctioned as compared to when such relearning is not performed.

<Second Embodiment> (where Resistance Change Elements are General Variable Resistors)

Hereinafter, a second embodiment of the product-sum operation device of the present invention will be described.

The product-sum operation device 1 of the second embodiment is configured similar to the product-sum operation device 1 of the first embodiment described above, except for the points described below. Therefore, according to the product-sum operation device 1 of the second embodiment, the same effects as those of the product-sum operation device 1 of the first embodiment described above can be obtained except for the points described below.

Figure 10:
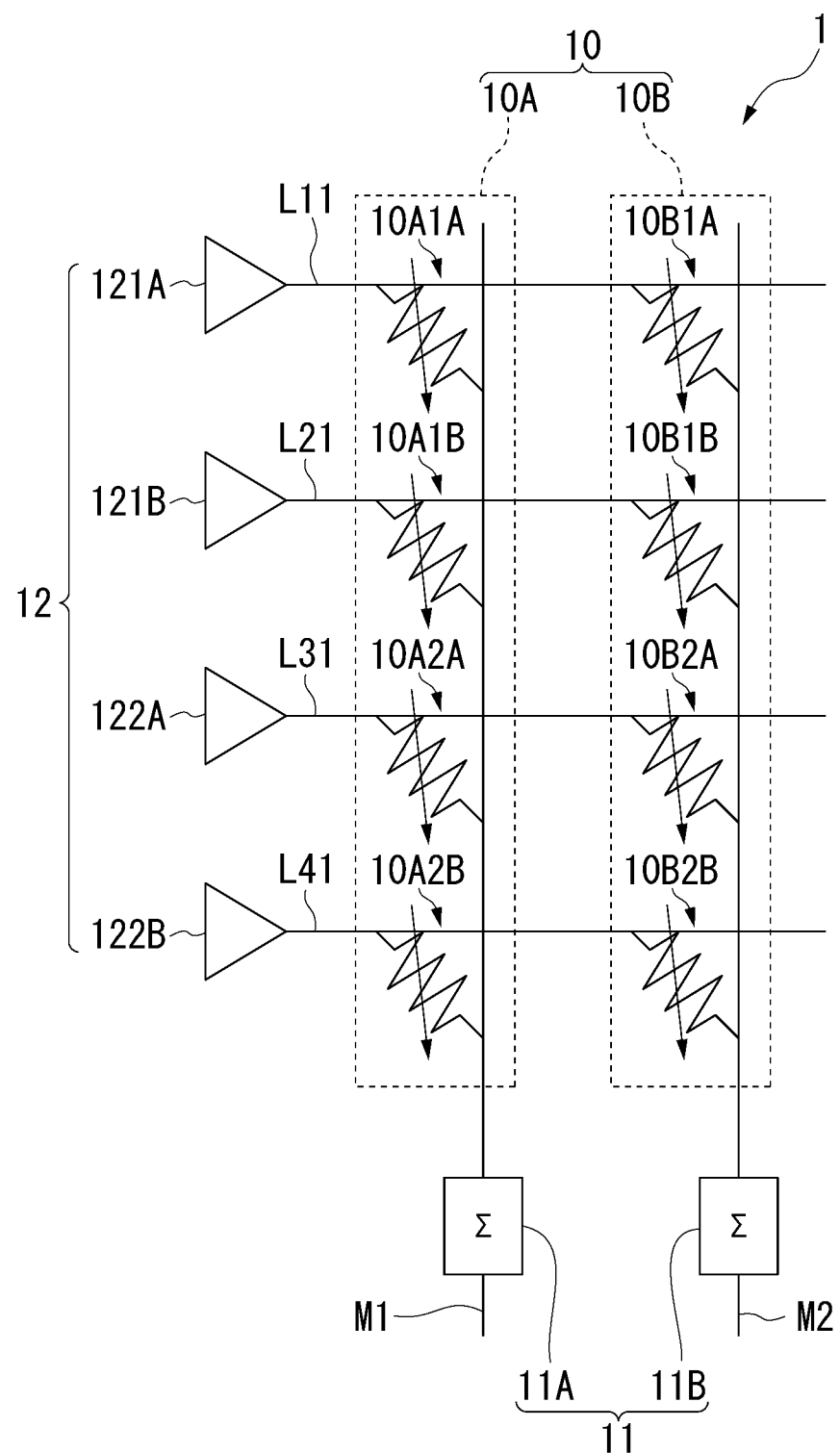
FIG. 10 is a diagram showing an example of a partial configuration of a product-sum operation device of a second embodiment.

FIG. 10 is a diagram showing an example of a partial configuration of the product-sum operation device 1 of the second embodiment.

In the product-sum operation device 1 of the first embodiment, the variable-input product operation elements 10A1A, 10A1B, 10B1A, and 10B1B and the fixed-input product operation elements 10A2A, 10A2B, 10B2A, and 10B2B are constituted by magnetoresistance effect elements. On the other hand, in the product-sum operation device 1 of the second embodiment, variable-input product operation elements 10A1A, 10A1B, 10B1A, and 10B1B and fixed-input product operation elements 10A2A, 10A2B, 10B2A, and 10B2B are constituted by general resistance change elements (variable resistors).

Specifically, in the example shown in FIG. 1, each of the variable-input product operation elements 10A1A, 10A1B, 10B1A, and 10B1B and the fixed-input product operation elements 10A2A, 10A2B, 10B2A, and 10B2B includes a read terminal, a write terminal, and a common terminal. On the other hands, in the example shown in FIG. 10, each of the variable-input product operation elements 10A1A, 10A1B, 10B1A, and 10B1B and the fixed-input product operation elements 10A2A, 10A2B, 10B2A, and 10B2B includes a first terminal and a second terminal.

In the example shown in FIG. 10, the first terminals of the variable-input product operation elements 10A1A and 10B1A are connected to a line L11. The first terminals of the variable-input product operation elements 10A1B and 10B1B are connected to a line L21. The first terminals of the fixed-input product operation elements 10A2A and 10B2A are connected to a line L31. The first terminals of the fixed-input product operation elements 10A2B and 10B2B are connected to a line L41.

Also in the example shown in FIG. 10, a fixed signal input to the fixed-input product operation elements 10A2A, 10A2B, 10B2A, and 10B2B is synchronized with variable signals input to the variable-input product operation elements 10A1A, 10A1B, 10B1A, and 10B1B.

In the example shown in FIG. 10, the second terminals of the variable-input product operation elements 10A1A and 10A1B and the fixed-input product operation elements 10A2A and 10A2B are connected to a line M1. The second terminals of the variable-input product operation elements 10B1A and 10B1B and the fixed-input product operation elements 10B2A and 10B2B are connected to a line M2.

A sum operator 11 includes an output detector 11A that detects the sum of outputs from the second terminals of the variable-input product operation elements 10A1A and 10A1B and the fixed-input product operation elements 10A2A and 10A2B and an output detector 11B that detects the sum of outputs from the second terminals of the variable-input product operation elements 10B1A and 10B1B and the fixed-input product operation elements 10B2A and 10B2B.

Also in the example shown in FIG. 10, the fixed-input product operation elements 10A2A, 10A2B, 10B2A, and 10B2B have a function of being disconnected when an output current increase malfunction has occurred, for example, by having a fuse portion or the like (not shown).

In another example, the fixed-input product operation elements 10A2A, 10A2B, 10B2A, and 10B2B shown in FIG. 10 may not have a function of being disconnected when an output current increase malfunction has occurred.

Although embodiments of the present invention have been described above in detail with reference to the drawings, the specific configurations thereof are not limited to those of the embodiments and also include various modifications and substitutions without departing from the spirit of the present invention. The specific configurations may also include combinations of the configurations described in the above embodiments.

For example, a program for realizing the functions of each device (for example, the product-sum operation device 1) according to the embodiments shown above may be recorded on a computer readable recording medium (storage medium) and a computer system may be caused to read and execute the program recorded on the recording medium to perform the processing.

The "computer system" referred to here may include an operating system (OS) or hardware such as peripheral devices.

The "computer readable recording medium" refers to a portable medium such as a flexible disk, a magneto-optical disk, a read only memory (ROM), a writable nonvolatile memory such as a flash memory, or a digital versatile disc (DVD), or a storage device such as a hard disk provided in a computer system. The recording medium may be, for example, a recording medium that temporarily records data.

It is assumed that the "computer readable recording medium" includes one that holds the program for a certain period of time, like a volatile memory (for example, a dynamic random access memory (DRAM)) provided in a computer system which serves as a server or a client when the program has been transmitted via a network such as the Internet or a communication line such as a telephone line.

The program may also be transmitted from a computer system in which the program is stored in a storage device or the like to another computer system via a transmission medium or by transmission waves in the transmission medium. Here, the "transmission medium" for transmitting the program refers to a medium having a function of transmitting information, like a network (a communication network) such as the Internet or a communication line (a communication wire) such as a telephone line.

The program may be one for realizing some of the above-described functions. The program may also be a so-called differential file (differential program) which can realize the above-described functions in combination with a program already recorded in the computer system.

In a computer, for example, a processor such as a central processing unit (CPU) reads and executes the program stored in a memory.

REFERENCE SIGNS LIST

1 Product-sum operation device
2 Product-sum operation device
10 Product operator
10A Column
10A1A Variable-input product operation element
10A1B Variable-input product operation element
10A2A Fixed-input product operation element
10A2B Fixed-input product operation element
10B Column
10B1A Variable-input product operation element
10B1B Variable-input product operation element
10B2A Fixed-input product operation element
10B2B Fixed-input product operation element
11 Sum operator
11A Output detector
11B Output detector
12 Input unit 121A Variable input unit
121B Variable input unit
122A Fixed input unit
122B Fixed input unit
13 Malfunction diagnosis unit
14 Relearning unit
100 Neuromorphic device
101 Input layer
101A, 101B, 101C, 101D Node
102 Hidden layer
102A, 102B, 102C Node
103 Output layer
103A, 103B, 103C Node
A Magnetoresistance effect element
AA Write terminal
AB Common terminal
AC Read terminal
A1 Magnetization free layer
A11 First region
A12 Second region
A2 Magnetization fixed layer
A3 Nonmagnetic layer
DW Domain wall
L11 Line
L12 Line
L21 Line
L22 Line
L31 Line
L32 Line
L41 Line
L42 Line
M1 Line
M2 Line

What is claimed is:

1. A product-sum operation device comprising a product operator, a sum operator, a variable input unit and a fixed input unit,
wherein the product operator includes a plurality of variable-input product operation elements and a plurality of fixed-input product operation elements connected to same line connected to the sum operator,
each of the plurality of variable-input product operation elements and the plurality of fixed-input product operation elements is a resistance change element,
the variable input unit configured to input a variable signal to the plurality of variable-input product operation elements; and
the fixed input unit configured to input a determined signal to the plurality of fixed-input product operation elements in synchronization with the variable signal, and
the sum operator includes an output detector configured to detect a sum of outputs from the plurality of variable-input product operation elements and outputs from the plurality of fixed-input product operation elements.

2. The product-sum operation device according to claim 1, wherein the plurality of fixed-input product operation elements have a function of being disconnected when an output current increase malfunction has occurred.

3. The product-sum operation device according to claim 1, wherein the resistance change element has a write terminal, a common terminal, and a read terminal.

4. The product-sum operation device according to claim 3, wherein the plurality of fixed-input product operation elements have a fuse portion in the read terminal or the common terminal.

5. The product-sum operation device according to claim 1, wherein the product operator further includes another variable-input product operation element and another fixed-input product operation element connected to same line connected to the sum operator,
each of the other variable-input product operation elements and the other fixed-input product operation elements is the resistance change element,
the variable input unit is configured to input the variable signal to the other variable-input product operation element,
the fixed input unit is configured to input the determined signal to the other fixed-input product operation element in synchronization with the variable signal, and
the sum operator further includes another output detector configured to detect a sum of an output from the other variable-input product operation element and an output from the other fixed-input product operation element.

6. A neuromorphic device comprising the product-sum operation device according to claim 1.

7. A method for using the product-sum operation device according to claim 1, wherein the product-sum operation device further comprises a malfunction diagnosis unit, and
the method comprises:
an output detection process in which the output detector detects outputs from the plurality of fixed-input product operation elements in a state in which the variable input unit does not input the variable signal to the plurality of variable-input product operation elements and the fixed input unit inputs the determined signal to the plurality of fixed-input product operation elements; and
a diagnosis process in which the malfunction diagnosis unit determines whether or not a malfunctioning product operation element is included in the plurality of fixed-input product operation elements on the basis of the outputs from the plurality of fixed-input product operation elements detected by the malfunction diagnosis unit in the output detection process.

8. The method for using the product-sum operation device according to claim 7, wherein the product-sum operation device further comprises a relearning unit, and
the method further comprises a relearning process in which when the malfunction diagnosis unit has determined that the malfunctioning product operation element is included in the plurality of fixed-input product operation elements, the relearning unit resets a resistance value of a product operation element other than the malfunctioning product operation element among the plurality of fixed-input product operation elements.

9. The product-sum operation device according to claim 1, wherein the resistance change element is a magnetoresistance effect element exhibiting a magnetoresistance effect, and
the magnetoresistance effect element includes:
a magnetization free layer having a domain wall;
a magnetization fixed layer whose magnetization direction is fixed; and
a nonmagnetic layer sandwiched between the magnetization free layer and the magnetization fixed layer.

* * * * *